(12) United States Patent
Byeon et al.

(10) Patent No.: US 8,050,110 B2
(45) Date of Patent: Nov. 1, 2011

(54) MEMORY DEVICE HAVING LATCH FOR CHARGING OR DISCHARGING DATA INPUT/OUTPUT LINE

(75) Inventors: Sang-Jin Byeon, Kyoungki-do (KR); Beom-Ju Shin, Kyoungki-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/640,883

(22) Filed: Dec. 17, 2009

(65) Prior Publication Data

US 2010/0091583 A1 Apr. 15, 2010

Related U.S. Application Data

(62) Division of application No. 11/477,529, filed on Jun. 30, 2006, now Pat. No. 7,656,717.

(30) Foreign Application Priority Data

Sep. 29, 2005 (KR) .................. 10-2005-0091566
Dec. 28, 2005 (KR) .................. 10-2005-0132577

(51) Int. Cl.
*G11C 7/10* (2006.01)
(52) U.S. Cl. .......... 365/189.05; 365/189.08; 365/230.08
(58) Field of Classification Search ............. 365/189.05, 365/189.08, 230.08, 189.02, 189.11, 230.03, 365/189.01, 191, 189.04, 201, 226
See application file for complete search history.

(56) References Cited

U.S. PATENT DOCUMENTS

| 5,808,490 | A | * | 9/1998 | Watanabe ........................ 327/94 |
| 6,307,791 | B1 | * | 10/2001 | Otsuka et al. ............. 365/189.05 |
| 6,489,807 | B2 | * | 12/2002 | Genna et al. ..................... 326/56 |
| 7,266,747 | B2 | * | 9/2007 | Foss ............................... 714/755 |
| 2005/0135158 | A1 | * | 6/2005 | Park ......................... 365/189.05 |
| 2005/0157532 | A1 | | 7/2005 | Yamamura |
| 2006/0104127 | A1 | * | 5/2006 | Cha et al. ................. 365/189.05 |

FOREIGN PATENT DOCUMENTS

CN 1637932 7/2005

OTHER PUBLICATIONS

Search Report issued from Taiwanese Intellectual Property Office on Jan. 25, 2011.
Patent Certificate issued from State Intellectual Property Office of the P.R.C on May 4, 2011.

* cited by examiner

*Primary Examiner* — Dang Nguyen
(74) *Attorney, Agent, or Firm* — IP & T Group LLP

(57) ABSTRACT

A semiconductor memory device of the claimed invention, having an active state for performing a read or write operation and an inactive state except for the active state includes a data input/output (I/O) line; a pull-up latch unit for pulling-up the data I/O line when the semiconductor memory device is in the inactive state; a pull-down latch unit for pulling-down the data I/O line when the semiconductor memory device is in the inactive state; and a selection unit for selectively driving one of the pull-up latch unit and the pull-down latch unit.

33 Claims, 8 Drawing Sheets

MEMORY DEVICE HAVING LATCH FOR CHARGING OR DISCHARGING DATA INPUT/OUTPUT LINE

This application is a division of U.S. patent application Ser. No. 11/477,529 filed on Jun. 30, 2006 now U.S. Pat. No. 7,656,717, which claims priority of Korean patent application number 10-2005-0091566 filed on Sep. 29, 2005 and Korean patent application number 10-2005-0132577 filed on Dec. 28, 2005. The disclosure of each of the foregoing applications is incorporated herein by reference in its entirety.

FIELD OF THE INVENTION

The present invention relates to a semiconductor memory device; and, more particularly, to a semiconductor memory device for preventing leakage current of a latch unit and a data input/output line connected with the latch unit.

DESCRIPTION OF RELATED ARTS

A semiconductor memory device is classified into an active state for performing a read or write operation and an inactive state, e.g., a standby mode and a self-refresh mode. When the semiconductor memory device stays in the active state for performing the read or write operation, a data input/output (I/O) line such as a global data I/O line and a local data I/O line varies according to a logic level of read or write data. When the semiconductor memory device stays in the inactive state, the data I/O line is fixed with a logic level 'HIGH' or a logic level 'LOW' by a latch unit for preventing coupling and floating.

FIG. 1 is a block diagram showing a latch unit and a global data I/O line of a conventional semiconductor memory device.

As shown, in the conventional semiconductor memory device, sixteen global data I/O lines 10 having global data GIO<0:15> are connected with the latch unit 20 for preventing the global data I/O line 10 from floating regardless of whether the semiconductor device is in an active state or an inactive state. Accordingly, the global data I/O line 10 maintains a logic level 'HIGH' or 'LOW' of read or write data which is previously latched by the latch unit 20.

If the global data I/O line 10 maintains the logic level of the read or write data previously latched by the latch unit 20 regardless of whether the semiconductor device is in the active state or the inactive state, unnecessary current is consumed by the global data I/O line 10 and the latch unit 20 according to the logic level of the data previously latched by the latch unit 20.

In case of a double data rate synchronous dynamic random access memory (DDR SDRAM), thirty-two global data I/O lines 10 are used; in case of a DDR2 SDRAM, sixty-four global data I/O lines 10 are used; and in case of a DDR3 SDRAM, on hundred twenty-eight global data I/O lines 10 are used. As the semiconductor memory device is rapidly operated, the unnecessary current that is consumed by the global data I/O line 10 and the latch unit 20 increases, thereby deteriorating direct current (CD).

SUMMARY OF THE INVENTION

It is, therefore, an object of the present invention to provide a semiconductor memory device for reducing unnecessary leakage current consumed by a global data input/output line and a latch unit when the semiconductor memory device is inactivate.

In accordance with an aspect of the present invention, there is provided a semiconductor memory device having an active state for performing a read or write operation and an inactive state, including: a data input/output (I/O) line; a latch unit for preventing the data I/O line from floating; and a charging unit for controlling the latch unit to charge the data I/O line when the semiconductor memory device is in the inactive state.

In accordance with another aspect of the present invention, there is provided a semiconductor memory device having an active state for performing a read or write operation and an inactive state, including: a data input/output (I/O) line; a latch unit for preventing the data I/O line from floating; and a discharging unit for controlling the latch unit to discharge the data I/O line when the semiconductor memory device is in the inactive state.

In accordance with a further aspect of the present invention, there is provided a semiconductor memory device, having an active state for performing a read or write operation and an inactive state, including: a data input/output (I/O) line; a pull-up latch unit for pulling-up the data I/O line when the semiconductor memory device is in the inactive state; a pull-down latch unit for pulling-down the data I/O line when the semiconductor memory device is in the inactive state; and a selection unit for selectively driving one of the pull-up latch unit and the pull-down latch unit.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a semiconductor memory device in accordance with the present invention will be described in detail referring to the accompanying drawings.

Figure 1:
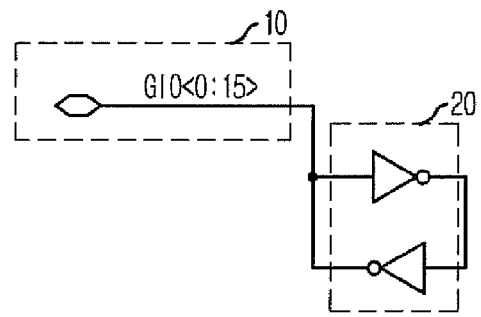
FIG. 1 is a block diagram of a latch unit and a global data I/O line of a conventional semiconductor memory device.
Figure 2:
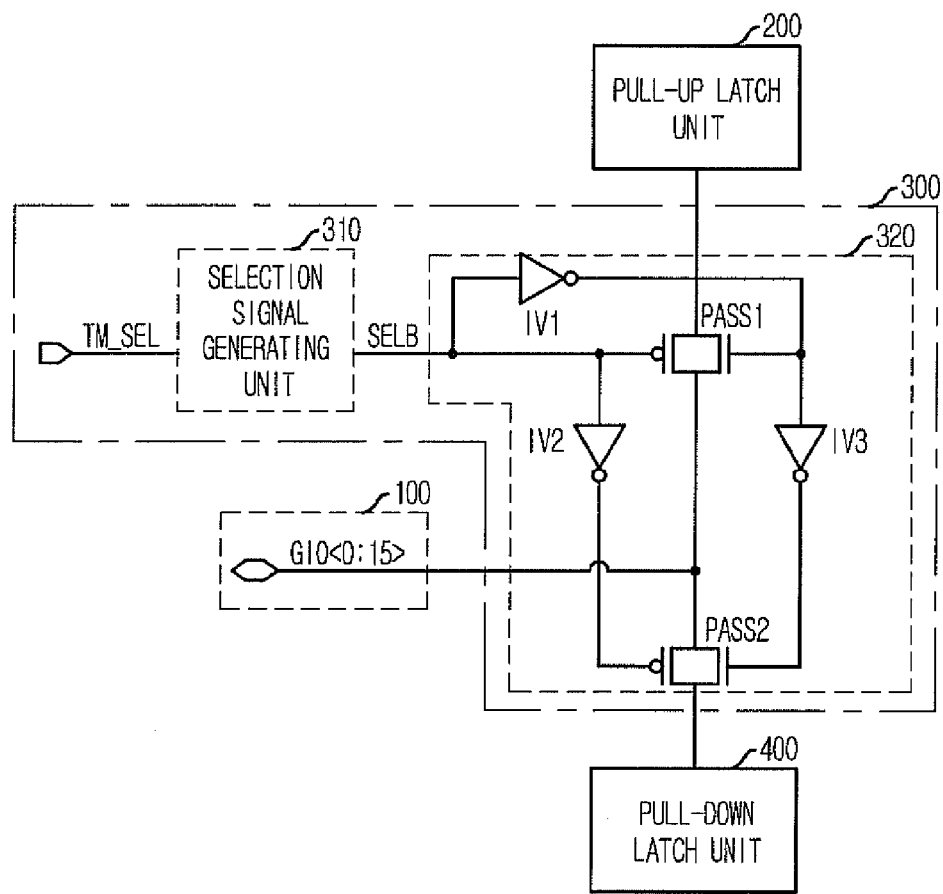
FIG. 2 is a block diagram of a semiconductor memory device having a latch unit for charging or discharging a global data I/O line in accordance with a first embodiment of the claimed invention.

FIG. 2 is a block diagram of a semiconductor memory device having a latch unit for charging or discharging a global data I/O line in accordance with a first embodiment of the claimed invention.

As shown, the semiconductor memory device includes a global data input/output (I/O) line 100, a latch unit, a charging unit, a discharge unit and a selection unit 300.

The latch unit is coupled to the global data I/O line 100 and prevents the global data I/O line 100 from floating. The charging unit charges the global data I/O line 100 via the latch unit when the semiconductor memory device is inactivated. The discharge unit discharges the global data I/O line 100 via the latch unit when the semiconductor memory device is inactivated. The selection unit 300 selectively drives one of the charging unit and the discharging unit.

Herein, the charge unit and a part of latch unit are represented as a pull-up latch unit 200; and the discharge unit and the other part of latch unit are represented as a pull-down latch unit 400.

The selection unit 300 includes a selection signal generating unit 310 and a multiplexer 320. The selection signal generating unit 310 generates a selection signal SELB for determining which of the pull-up latch unit 200 and the pull-down latch unit 400 is selected. The multiplexer 320 selects one of the pull-up latch unit 200 and the pull-down latch unit 400 based on the selection signal SELB and drives the selected one.

The multiplexer 320 includes first to third inverters IV1 to IV3 and first and second transfer gates PASS1 and PASS2. The first inverter IV1 inverts the selection signal SELB; and the first transfer gate PASS1 controls the pull-up latch unit 200 in response to the selection signal SELB and an output of the first inverter IV1. The second inverter IV2 inverts the selection signal SELB; the third inverter IV3 inverts the output of the first inverter IV1; and the second transfer gate PASS2 controls the pull-down latch unit 400 in response to outputs of the second and third inverters IV2 and IV3.

A method for selectively driving the pull-up latch unit 200 and the pull-down latch unit 400 is described as follows.

First, an amount of a leakage current flowing in the global data I/O line 100 measured by a test device is compared with that flowing in transistors provided in the pull-up latch unit 200 or the pull-down latch unit 400 selected by the selection unit 300.

When the amount of the leakage current in flowing the global data I/O line 100 is larger than that flowing in the transistors of the pull-up latch unit 200 or the pull-down latch unit 400, the global data I/O line 100 is discharged to a ground voltage VSS for saving a current amount. Otherwise, i.e., the amount of the leakage current flowing in the global data I/O line 100 is smaller than that flowing in the transistors of the pull-up latch unit 200 or the pull-down latch unit 400, the global data I/O line 100 is charged by a source voltage, e.g., a peripheral voltage VPERI, for preventing unnecessary current consumption.

In the present invention, an inactive state of the semiconductor memory device includes a standby mode and a self-refresh mode. In particular, an effect of the invention is maximized in the standby mode or the self-refresh mode.

In addition, the global data I/O line 100 may include not only a local data I/O line but also all of the data I/O lines which are fixed with a logic level 'HIGH' or 'LOW' by the latch unit for preventing the global data I/O line 100 from floating or coupling.

Further, the claimed invention may include the pull-up latch unit 200 and the pull-down latch unit 400 without the selection unit 300.

Figure 3:
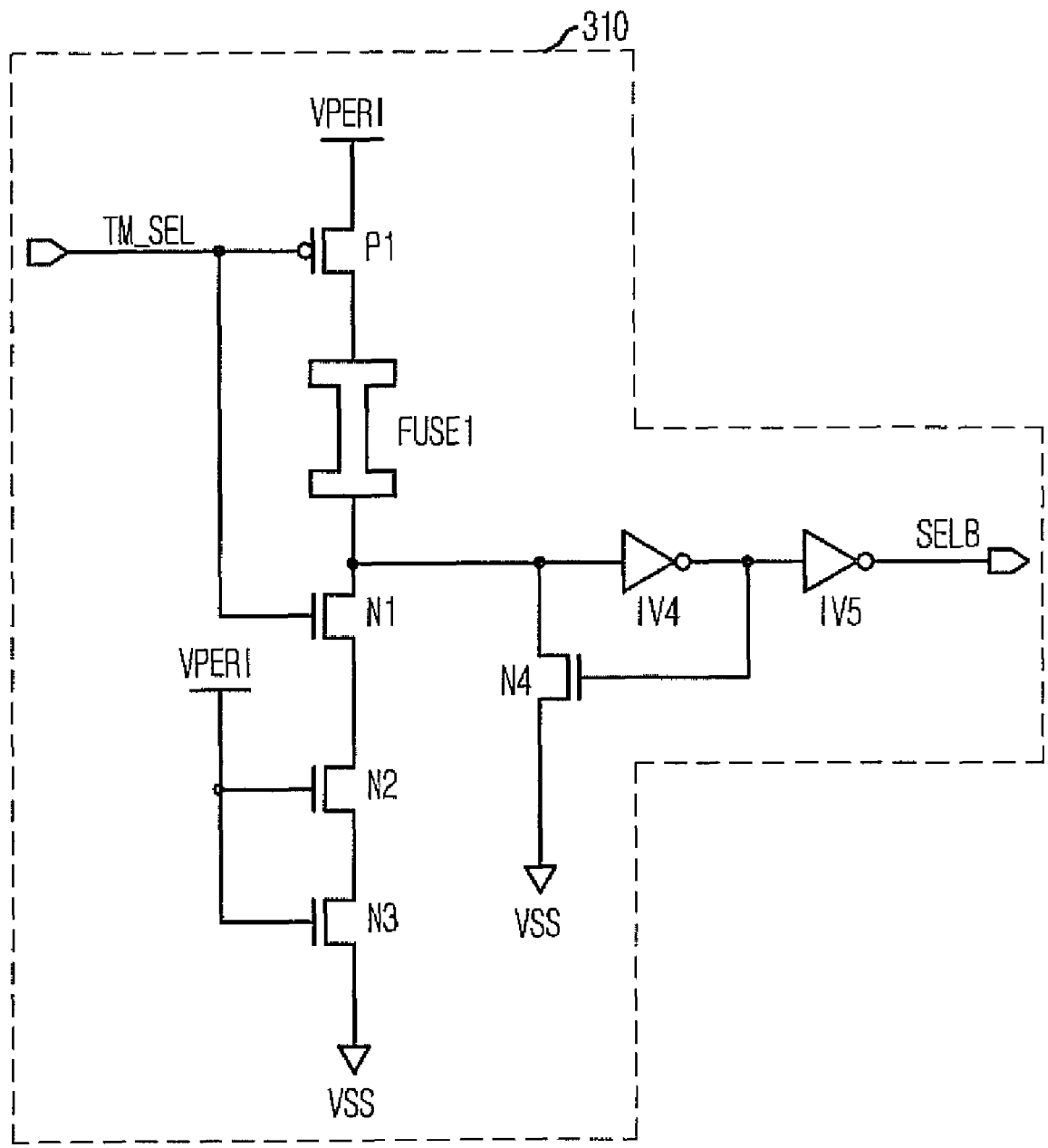
FIG. 3 is a detailed block diagram of a selection signal generator shown in FIG. 2.

FIG. 3 is a detailed block diagram of the selection signal generator 310 shown in FIG. 2.

As shown, the selection signal generator 310 includes a plurality of MOS transistors, a fuse FUSE1, and a plurality of inverters.

The first PMOS transistor P1, the fuse FUSE1 and the first to third NMOS transistors N1 to N3 are connected in series between the peripheral voltage VPERI and the ground voltage VSS. Each of the first PMOS transistor P1 and the first NMOS transistor N1 has a gate for receiving a test mode selecting signal TM_SEL which is enabled during a test mode. Each of the second and third NMOS transistors N2 and N3 has a gate for receiving the peripheral voltage VPERI. The fuse FUSE1 fixes a logic level of the selection signal SELB after the test mode. The first inverter IV4 has an input terminal coupled to a common terminal of the first NMOS transistor N1 and the fuse FUSE1; the second inverter IV5 has an input terminal coupled to an output terminal of the first inverter IV4; and the third inverter IV6 has an input terminal coupled to an output terminal of the second inverter IV5 and an output terminal for outputting the selection signal SELB. The fourth NMOS transistor N4 is coupled between the ground voltage VSS and the common terminal of the first NMOS transistor N1 and the fuse FUSE1 has a gate for receiving an output of the first NMOS transistor IV4.

The selection signal generator 310 receives the test mode selection signal TM_SEL enabled during the test mode and determines whether the fuse FUSE1 is cut or not based on a comparison result which is generated by comparing the amount of the leakage current flowing in the global data I/O line 100 with that flowing in the transistors provided in the pull-up latch unit 200 or the pull-down latch unit 400.

When the test mode selection signal TM_SEL is activated with a logic level 'HIGH', the selection signal SELB is also activated with a logic level 'HIGH'. As a result, the global data I/O line 100 is discharged as a logic level 'LOW'. Otherwise, when the test mode selection signal TM_SEL is inactivated with a logic level 'LOW', the selection signal SELB is also inactivated with a logic level 'LOW'. As a result, the global data I/O line 100 is charged as a logic level 'HIGH'.

As described above, the claimed invention may reduce the leakage current flowing in the transistors in the pull-up latch unit 200 or the pull-down latch unit 400 when at least one global data I/O line 100 is inactivated as a logic level 'LOW' during charging. Likewise, it is possible to reduce the leakage current flowing in the transistors in the pull-up latch unit 200 or the pull-down latch unit 400, when at least one global data I/O line 100 is activated as a logic level 'HIGH' during discharging.

Figure 4:
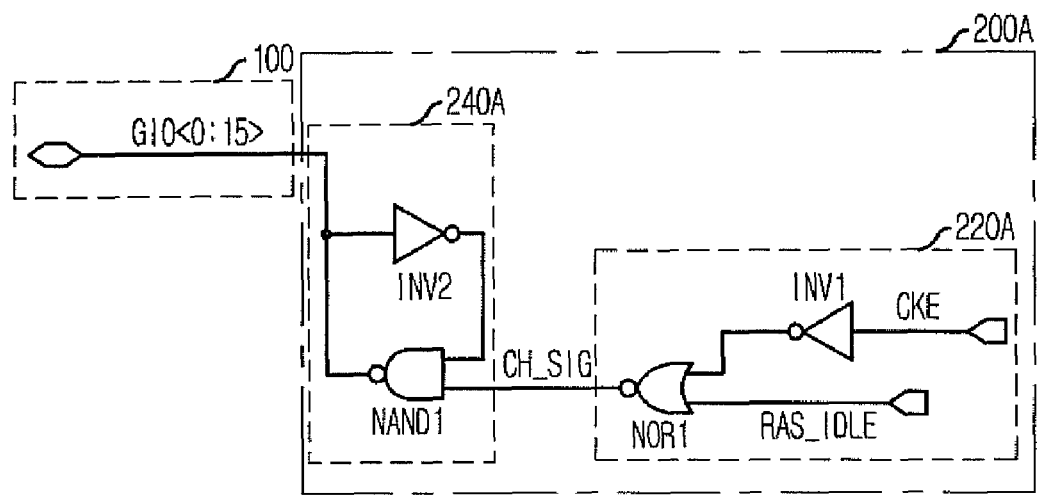
FIG. 4 is a block diagram of a pull-up latch unit for charging a global data I/O line based on a clock enable signal and a RAS idle signal in case of a standby mode in accordance with a second embodiment of the present invention.

Hereinafter, referring to FIGS. 4 to 15, in accordance with other embodiments of the present invention, the pull-up latch unit 200 and the pull-down latch unit 400 for charging and discharging the global data I/O line 100 without selection unit 300 will be described in detail FIG. 4 is a block diagram of a pull-up latch unit for charging a global data I/O line based on a clock enable signal and a RAS idle signal during a standby mode in accordance with a second embodiment of the present invention.

As shown, the pull-up latch unit 200A includes a charging unit 220A and a latch unit 240A. The charging unit 220A determines a logic level of a charging signal CH_SIG generated by combining a clock enable signal CKE and a RAS idle signal RAS_IDLE.

The charging unit 220A includes a first inverter INV1 and a first NOR gate NOR1. The first inverter INV1 receives and inverts the clock enable signal CKE. The first NOR gate NOR1 performs a NOR operation of the RAS idle signal RAS_IDLE and an output of the first inverter INV1 and outputs the charging signal CH_SIG to the latch unit 240A.

The latch unit 240A includes a first NAND gate NAND1 and a second inverter INV2. The first NAND gate NAND1 has one input terminal for receiving the charging signal CH_SIG and an output terminal coupled to the global data I/O line 100. The second inverter INV2 inverts an output of the first NAND gate NAND1 and outputs the inverted signal to the other input terminal of the first NAND gate NAND1.

Figure 5:
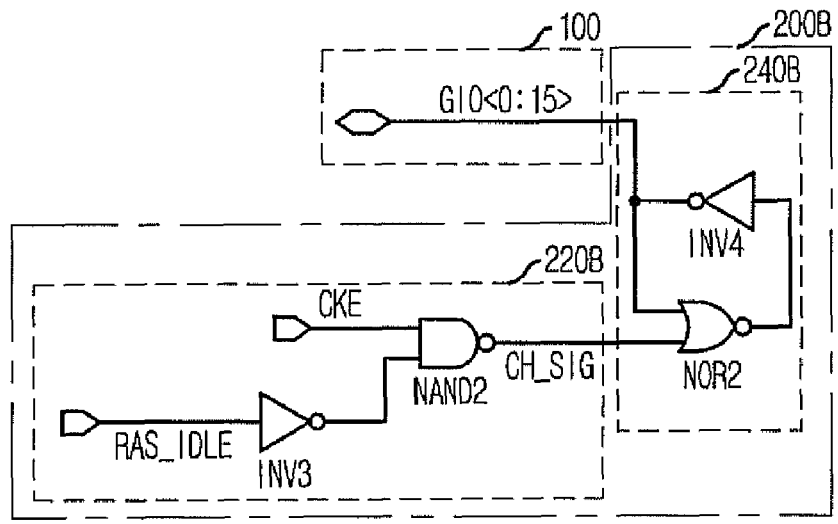
FIG. 5 is a block diagram of a pull-up latch unit for charging a global data I/O line based on a clock enable signal and a RAS idle signal in case of a standby mode in accordance with a third embodiment of the present invention.

FIG. 5 is a block diagram of a pull-up latch unit for charging a global data I/O line based on a clock enable signal and a RAS idle signal during a standby mode in accordance with a third embodiment of the present invention.

As shown, the pull-up latch unit 200B includes a charging unit 220B and a latch unit 240B. The charging unit 220B determines a logic level of a charging signal CH_SIG generated by combining a clock enable signal CKE and a RAS idle signal RAS_IDLE.

The charging unit 220B includes a first inverter INV3 and a first NAND gate NAND2. The first inverter INV3 receives and inverts the RAS idle signal RAS_IDLE. The first NAND gate NAND2 performs a NAND operation of the clock enable signal CKE and an output of the first inverter INV3 and outputs the charging signal CH_SIG to the latch unit 240B.

The latch unit 240B includes a first NOR gate NOR2 and a second inverter INV4. The first NOR gate NOR2 has one input terminal for receiving the charging signal CH_SIG. The second inverter INV4 inverts an output of the first NOR gate NOR2 and outputs the inverted signal to the global data I/O line 100 and the other input terminal of the first NOR gate NOR2.

Referring to FIGS. 4 and 5, if the clock enable signal CKE denoting an enable state of a clock signal is inactivated as a logic level 'LOW' or the RAS idle signal RAS_IDLE showing the standby mode is activated as a logic level 'HIGH', the charging unit charges the global data I/O line with a logic level 'HIGH' via the latch unit.

Figure 6:
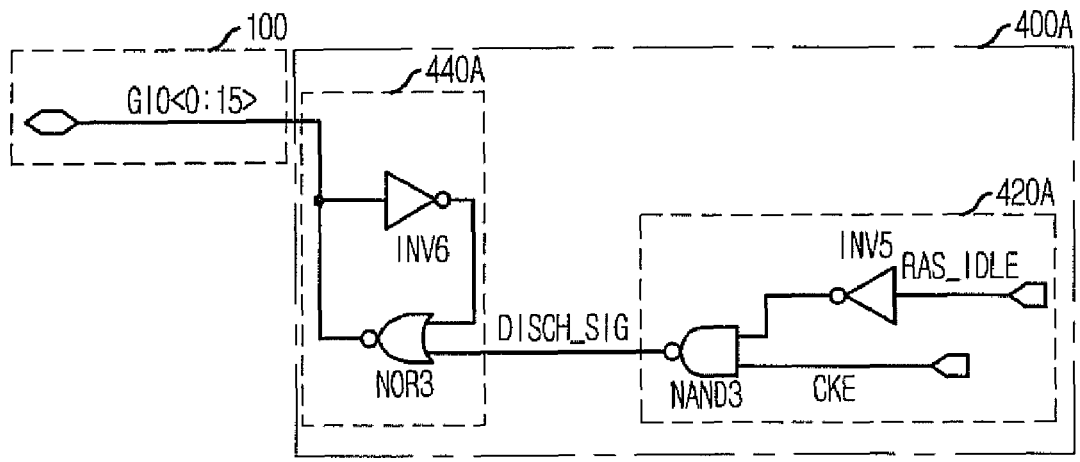
FIG. 6 is a block diagram of a pull-down latch unit for discharging a global data I/O line based on a clock enable signal and a RAS idle signal in case of a standby mode in accordance with a fourth embodiment of the present invention.

FIG. 6 is a block diagram showing a pull-down latch unit for discharging a global data I/O line based on a clock enable signal and a RAS idle signal during a standby mode in accordance with a fourth embodiment of the present invention.

As shown, the pull-down latch unit 400A includes a discharging unit 420A and a latch unit 440A. The discharging unit 420A determines a logic level of a discharging signal DISCH_SIG generated by combining a clock enable signal CKE and a RAS idle signal RAS_IDLE.

The discharging unit 420A includes a first inverter INV5 and a first NAND gate NAND3. The first inverter INV5 receives and inverts the RAS idle signal RAS_IDLE. The first NAND gate NAND3 performs a NAND operation of the clock enable signal CKE and an output of the first inverter INV5 and outputs the discharging signal DISCH_SIG to the latch unit 440A.

The latch unit 440A includes a first NOR gate NOR3 and a second inverter INV6. The first NOR gate NOR3 has one input terminal for receiving the discharging signal DISCH_SIG and an output terminal coupled to the global data I/O line 100. The second inverter INV6 inverts an output of the first NOR gate NOR3 and outputs the inverted signal to the other input terminal of the first NOR gate NOR3.

Figure 7:
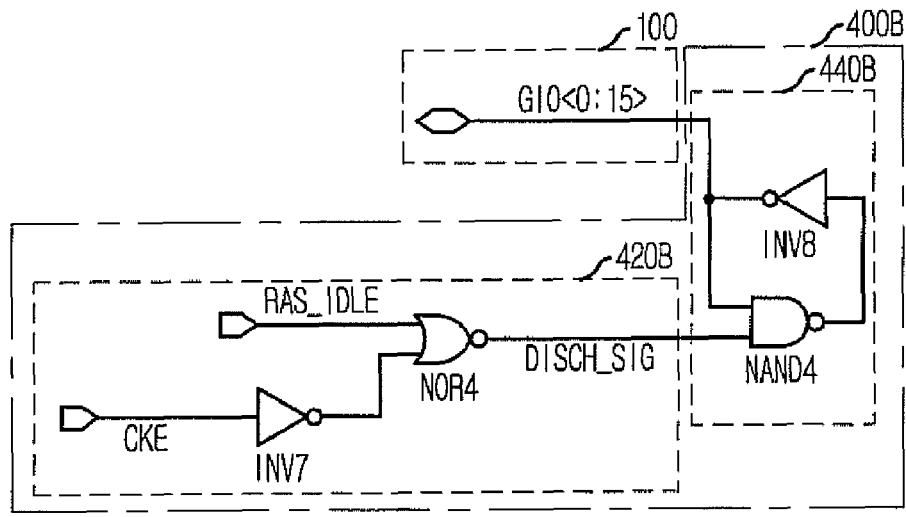
FIG. 7 is a block diagram of a pull-down latch unit for discharging a global data I/O line based on a clock enable signal and a RAS idle signal in case of a standby mode in accordance with a fifth embodiment of the present invention.

FIG. 7 is a block diagram showing a pull-down latch unit for discharging a global data I/O line based on a clock enable signal and a RAS idle signal during a standby mode in accordance with a fifth embodiment of the present invention.

As shown, the pull-down latch unit 400B includes a discharging unit 420B and a latch unit 440B. The discharging unit 420B determines a logic level of a discharging signal DISCH_SIG generated by combining a clock enable signal CKE and a RAS idle signal RAS_IDLE.

The discharging unit 420B includes a first inverter INV7 and a first NOR gate NOR4. The first inverter INV7 receives and inverts the clock enable signal CKE. The first NOR gate NOR4 performs a NOR operation of the RAS idle signal RAS_IDLE and an output of the first inverter INV7 and outputs the discharging signal DISCH_SIG to the latch unit 440B.

The latch unit 440B includes a first NAND gate NAND4 and a second inverter INV8. The first NAND gate NAND4 has one input terminal for receiving the discharging signal DISCH_SIG. The second inverter INV8 inverts an output of the first NAND gate NAND4 and outputs the inverted signal to the global data I/O line 100 and the other input terminal of the first NAND gate NAND4.

Referring to FIGS. 6 and 7, if the clock enable signal CKE is inactivated as a logic level 'LOW' and the RAS idle signal RAS_IDLE is activated as a logic level 'HIGH', the discharging unit discharges the global data I/O line with a logic level 'LOW' via the latch unit.

Figure 8:
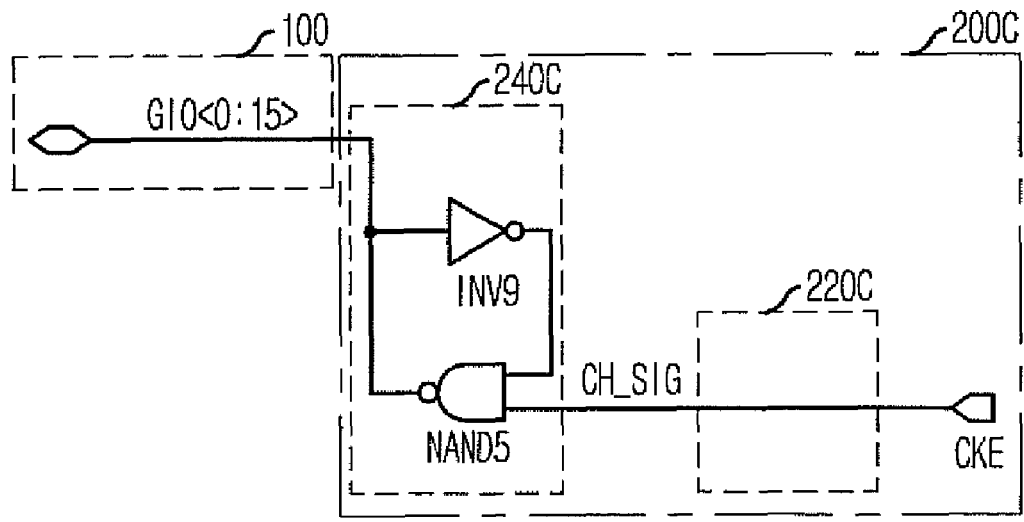
FIG. 8 is a block diagram of a pull-up latch unit for charging a global data I/O line based on a clock enable signal in case of a standby mode in accordance with a sixth embodiment of the present invention.

FIG. 8 is a block diagram showing a pull-up latch unit for charging a global data I/O line based on a clock enable signal during a standby mode in accordance with a sixth embodiment of the present invention.

As shown, the pull-up latch unit 200C includes a charging unit 220C and a latch unit 240C. The charging unit 220C determines a logic level of a charging signal CH_SIG based on a clock enable signal CKE.

The charging unit 220C receives the clock enable signal CKE and outputs the clock enable signal CKE as the charging signal CH_SIG to the latch unit 240C.

The latch unit 240C includes a first NAND gate NAND5 and a first inverter INV9. The first NAND gate NAND5 has one input terminal for receiving the charging signal CH_SIG and an output terminal coupled to the global data I/O line 100. The first inverter INV9 inverts an output of the first NAND gate NAND5 and outputs the inverted signal to the other input terminal of the first NAND gate NAND5.

Figure 9:
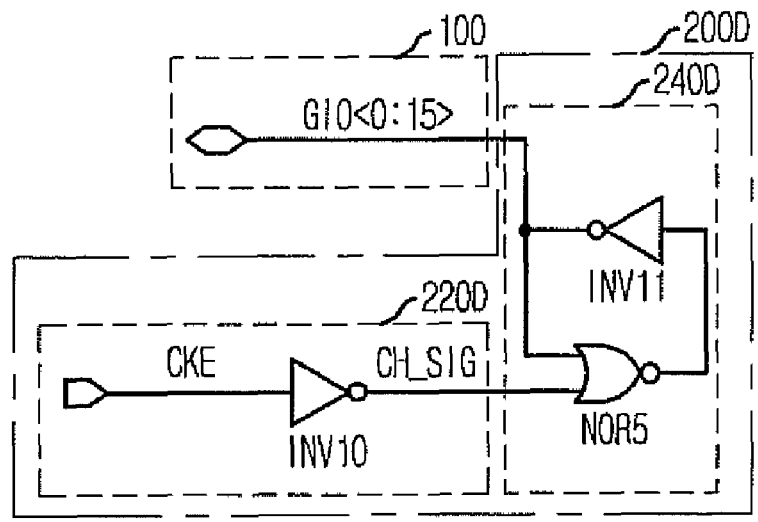
FIG. 9 is a block diagram of a pull-up latch unit for charging a global data I/O line based on a clock enable signal in case of a standby mode in accordance with a seventh embodiment of the present invention.

FIG. 9 is a block diagram showing a pull-up latch unit for charging a global data I/O line based on a clock enable signal during a standby mode in accordance with a seventh embodiment of the present invention.

As shown, the pull-up latch unit 200D includes a charging unit 220D and a latch unit 240D. The charging unit 220D determines a logic level of a charging signal CH_SIG based on a clock enable signal CKE.

The charging unit 220D includes a first inverter INV10 for inverting the clock enable signal CKE and outputting the inverted signal as the charging signal CH_SIG to the latch unit 240D.

The latch unit 240D includes a first NOR gate NOR5 and a second inverter INV11. The first NOR gate NOR5 has one input terminal for receiving the charging signal CH_SIG. The second inverter INV11 inverts an output of the first NOR gate NOR5 and outputs the inverted signal to the global data I/O line 100 and the other input terminal of the first NOR gate NOR5.

Referring to FIGS. 8 and 9, if the clock enable signal CKE denoting an enable state of a clock signal is inactivated as a logic level 'LOW', the charging unit charges the global data I/O line with a logic level 'HIGH' via the latch unit.

Figure 10:
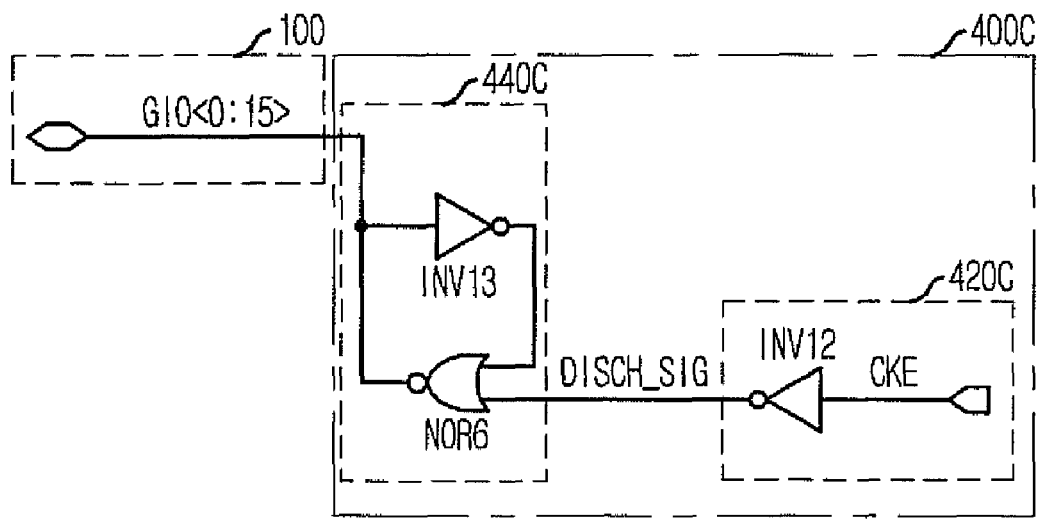
FIG. 10 is a block diagram of a pull-down latch unit for discharging a global data I/O line based on a clock enable signal in case of a standby mode in accordance with a eighth embodiment of the present invention.

FIG. 10 is a block diagram showing a pull-down latch unit for discharging a global data I/O line based on a clock enable signal during a standby mode in accordance with a eighth embodiment of the present invention.

As shown, the pull-down latch unit 400C includes a discharging unit 420C and a latch unit 4400. The discharging unit 4200 determines a logic level of a discharging signal DISCH_SIG based on a clock enable signal CKE.

The discharging unit 420C includes a first inverter INV12 for inverting the clock enable signal CKE and outputting the inverted signal as the discharging signal DISCH_SIG to the latch unit 440C.

The latch unit 440C includes a first NOR gate NOR6 and a second inverter INV13. The first NOR gate NOR6 has one input terminal for receiving the discharging signal DISCH_SIG and an output terminal coupled to the global data I/O line 100. The second inverter INV13 inverts an output of the first NOR gate NOR5 and outputs the inverted signal to the other input terminal of the first NOR gate NOR6.

Figure 11:
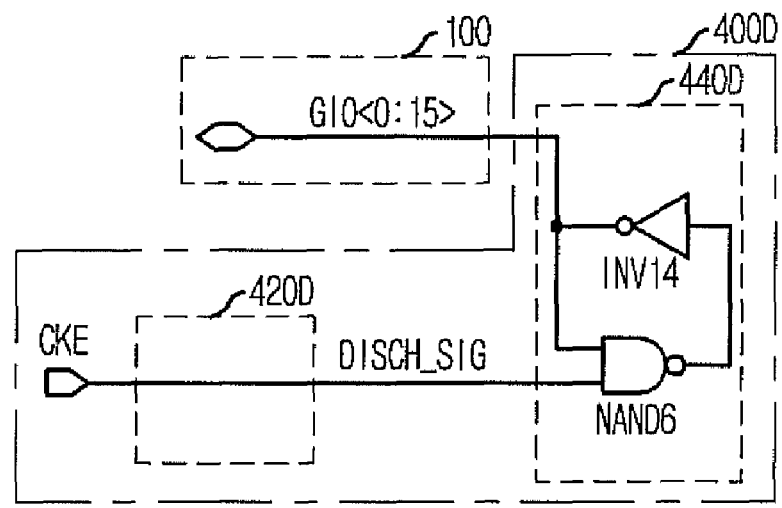
FIG. 11 is a block diagram of a pull-down latch unit for discharging a global data I/O line based on a clock enable signal in case of a standby mode in accordance with a ninth embodiment of the present invention.

FIG. 11 is a block diagram showing a pull-down latch unit for discharging a global data I/O line based on a clock enable signal during a standby mode in accordance with a ninth embodiment of the present invention.

As shown, the pull-down latch unit 400D includes a discharging unit 420D and a latch unit 440D. The discharging unit 420D determines a logic level of a discharging signal DISCH_SIG based on a clock enable signal CKE.

The discharging unit 420D receives the clock enable signal CKE and outputs the clock enable signal CKE as the discharging signal DISCH_SIG to the latch unit 440D.

The latch unit 440D includes a first NAND gate NAND6 and a first inverter INV14. The first NAND gate NAND6 has one input terminal for receiving the discharging signal DISCH_SIG. The first inverter INV14 inverts an output of the first NAND gate NAND6 and outputs the inverted signal to the global data I/O line 100 and the other input terminal of the first NAND gate NAND6.

Referring to FIGS. 10 and 11, if the clock enable signal CKE denoting an enable state of a clock signal is inactivated as a logic level 'LOW', the discharging unit discharges the global data I/O line with a logic level 'LOW' via the latch unit.

Figure 12:
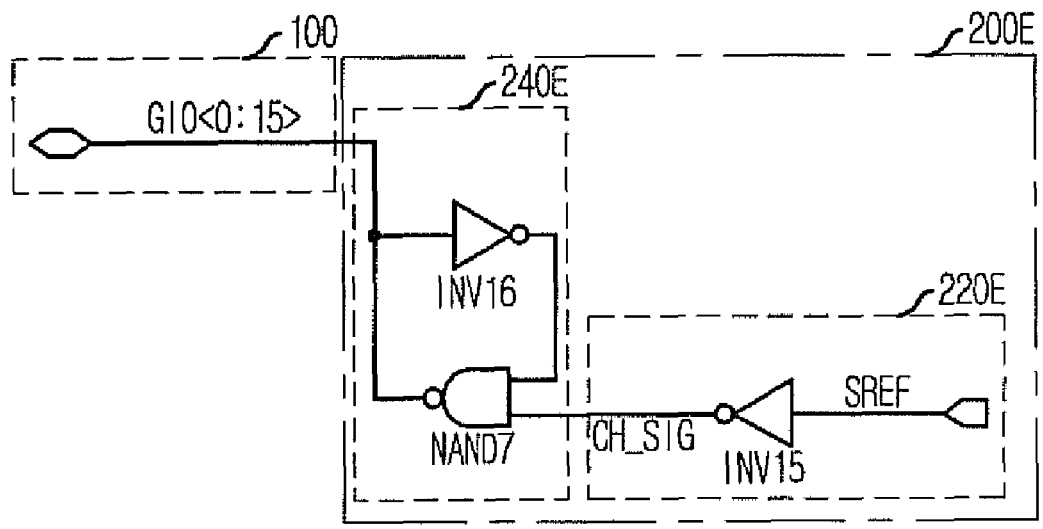
FIG. 12 is a block diagram of a pull-up latch unit for charging a global data I/O line based on a self-refresh signal in case of a self-refresh mode in accordance with a tenth embodiment of the present invention.

FIG. 12 is a block diagram showing a pull-up latch unit for charging a global data I/O line based on a self-refresh signal during a self-refresh mode in accordance with a tenth embodiment of the present invention.

As shown, the pull-up latch unit 200E includes a charging unit 220E and a latch unit 240E. The charging unit 220E determines a logic level of a charging signal CH_SIG based on a self-refresh signal SREF.

The charging unit 220E includes a first inverter INV15 for inverting the self-refresh signal SREF and outputting the inverted signal as the charging signal CH_SIG to the latch unit 240E.

The latch unit 240E includes a first NAND gate NAND7 and a second inverter INV16. The first NAND gate NAND7 has one input terminal for receiving the charging signal CH_SIG and an output terminal coupled to the global data I/O line 100. The second inverter INV16 inverts an output of the first NAND gate NAND7 and outputs the inverted signal to the other input terminal of the first NAND gate NAND7.

Figure 13:
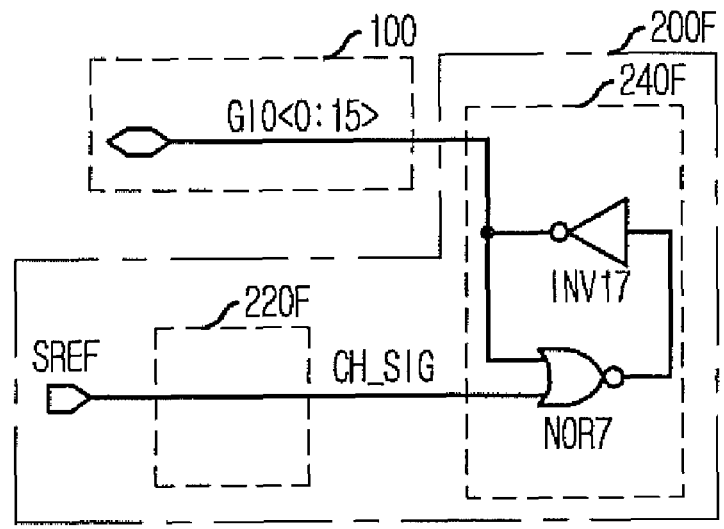
FIG. 13 is a block diagram of a pull-up latch unit for charging a global data I/O line based on a self-refresh signal in case of a self-refresh mode in accordance with a eleventh embodiment of the present invention.

FIG. 13 is a block diagram showing a pull-up latch unit for charging a global data I/O line based on a self-refresh signal during a self-refresh mode in accordance with a eleventh embodiment of the present invention.

As shown, the pull-up latch unit 200F includes a charging unit 220F and a latch unit 240F. The charging unit 220F determines a logic level of a charging signal CH_SIG based on a self-refresh signal SREF.

The charging unit 220F receives the self-refresh signal SREF and outputs the self-refresh signal SREF as the charging signal CH_SIG to the latch unit 240F.

The latch unit 240F includes a first NOR gate NOR7 and a first inverter INV17. The first NOR gate NOR7 has one input terminal for receiving the charging signal CH_SIG. The first inverter INV16 inverts an output of the first NOR gate NOR7 and outputs the inverted signal to the global data I/O line 100 and the other input terminal of the first NOR gate NOR7.

Referring to FIGS. 12 and 13, if the self-refresh signal SREF denoting the self-refresh mode is activated as a logic level 'HIGH', the charging unit charges the global data I/O line with a logic level 'HIGH' via the latch unit.

Figure 14:
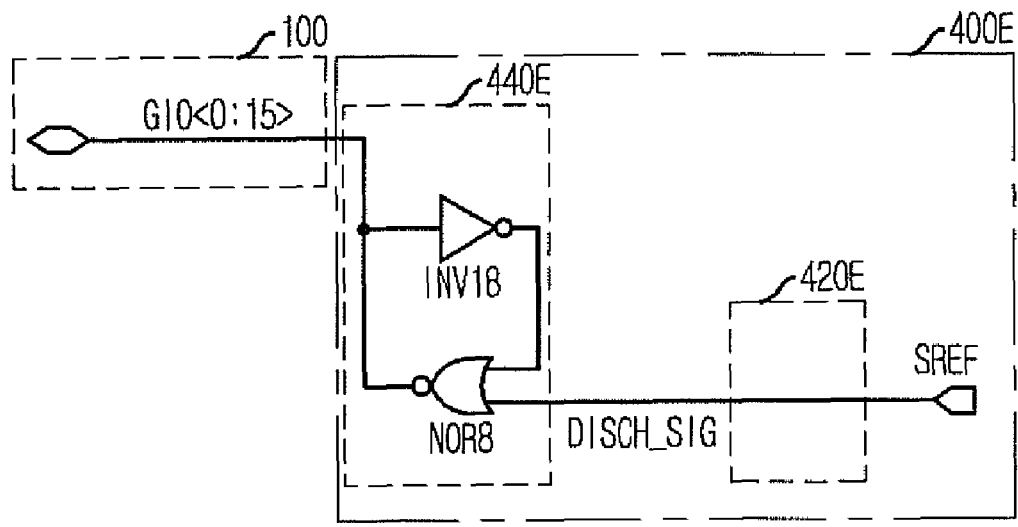
FIG. 14 is a block diagram of a pull-down latch unit for discharging a global data I/O line based on a self-refresh signal in case of a self-refresh mode in accordance with a twelfth embodiment of the present invention.

FIG. 14 is a block diagram showing a pull-down latch unit for discharging a global data I/O line based on a self-refresh signal during a self-refresh mode in accordance with a twelfth embodiment of the present invention.

As shown, the pull-down latch unit 400E includes a discharging unit 420E and a latch unit 440E. The discharging unit 420E determines a logic level of a discharging signal DISCH_SIG based on a self-refresh signal SREF.

The discharging unit 420E receives the self-refresh signal SREF and outputs the self-refresh signal SREF as the discharging signal DISCH_SIG to the latch unit 440E.

The latch unit 440E includes a first NOR gate NOR8 and a first inverter INV18. The first NOR gate NOR8 has one input terminal for receiving the discharging signal DISCH_SIG and an output terminal coupled to the global data I/O line 100. The first inverter INV18 inverts an output of the first NOR gate NOR8 and outputs the inverted signal to the other input terminal of the first NOR gate NOR8.

Figure 15:
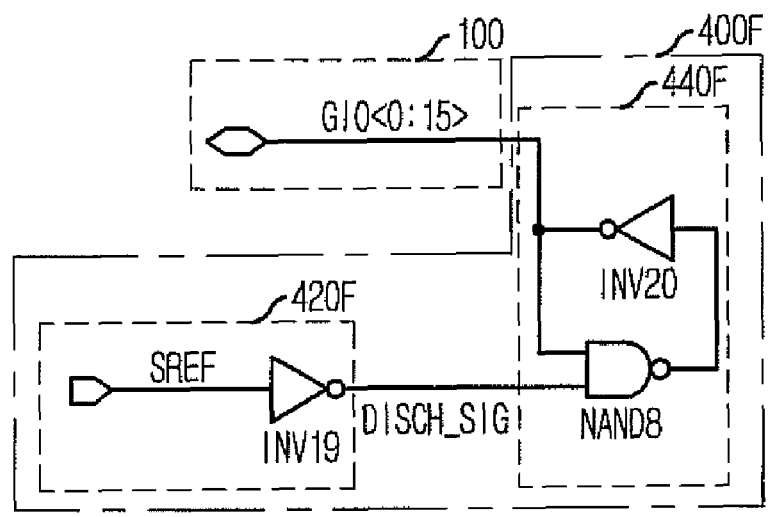
FIG. 15 is a block diagram of a pull-down latch unit for discharging a global data I/O line based on a self-refresh signal in case of a self-refresh mode in accordance with a thirteenth embodiment of the present invention.

FIG. 15 is a block diagram showing a pull-down latch unit for discharging a global data I/O line based on a self-refresh signal during a self-refresh mode in accordance with a thirteenth embodiment of the present invention.

As shown, the pull-down latch unit 400F includes a discharging unit 420F and a latch unit 440F. The discharging unit 420F determines a logic level of a discharging signal DISCH_SIG based on a self-refresh signal SREF.

The discharging unit 420F includes a first inverter INV19 for inverting the self-refresh signal SREF and outputting the inverted signal as the discharging signal DISCH_SIG to the latch unit 440F.

The latch unit 440F includes a first NAND gate NAND8 and a second inverter INV20. The first NAND gate NAND8 has one input terminal for receiving the discharging signal DISCH_SIG. The second inverter INV20 inverts an output of the first NAND gate NAND8 and outputs the inverted signal to the global data I/O line 100 and the other input terminal of the first NAND gate NAND8.

Referring to FIGS. 14 and 15, if the self-refresh signal SREF is activated as a logic level 'HIGH', the discharging unit discharges the global data I/O line with a logic level 'LOW' via the latch unit.

As described above, in the claimed invention, the semiconductor memory device charges or discharges the global data I/O line 100 based on a signal notifying that the global data I/O line is inactivated, e.g., the clock enable signal CKE and the RAS idle signal RAS_IDLE in case of the standby mode and the self-refresh signal SREF in case of the self-refresh mode. Accordingly, it is possible to reduce the leakage current flowing the pull-up latch unit 200 or the pull-down latch unit 400, and the global data I/O line global data I/O line 100 by selectively charging or discharging the global data I/O line 100. Further, it is possible to improve a characteristic of a direct current (DC) of the semiconductor memory device.

The present application contains subject matter related to Korean patent application Nos. 2005-91566 & 2005-132577, filed in the Korean Patent Office on Sep. 29, 2005 & Dec. 28, 2005, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device having an active state for performing a read or write operation and an inactive state, comprising:
 a data input/output (I/O) line;
 a pull-up latch unit for pulling-up the data I/O line when the semiconductor memory device is in the inactive state;
 a pull-down latch unit for pulling-down the data I/O line when the semiconductor memory device is in the inactive state; and
 a selection unit for selectively driving one of the pull-up latch unit and the pull-down latch unit,
 wherein the pull-up latch unit includes:
  a latch unit for preventing the data I/O line from floating; and
  a charging unit for controlling the latch unit to charge the data I/O line when the semiconductor memory device is in the inactive state by determining a logic level of an output signal of the latch unit based on a charging signal generated by combining a clock enable signal denoting an enable state of a clock signal of the semiconductor memory device and a row address strobe (RAS) idle signal transitioning a standby mode.

2. The semiconductor memory device as recited in claim 1, wherein inactive state comprises the standby mode and a self-refresh mode.

3. The semiconductor memory device as recited in claim 1, wherein the charging unit includes:
 a first inverter for inverting the clock enable signal; and
 a NOR gate for performing a NOR operation of the RAS idle signal and an output of the first inverter to output the charging signal to the latch unit.

4. The semiconductor memory device as recited in claim 3, wherein the latch unit includes:
 a NAND gate having one input terminal for receiving the charging signal and an output terminal coupled to the data I/O line; and
 a second inverter for inverting an output of the NAND gate and outputting the inverted signal to the other input terminal of the NAND gate.

5. The semiconductor memory device as recited in claim 1, wherein the charging unit includes:
 a first inverter for inverting the RAS idle signal; and
 a NAND gate for performing a NAND operation of the clock enable signal and an output of the first inverter to output the charging signal to the latch unit.

6. The semiconductor memory device as recited in claim 5, wherein the latch unit includes:
 a NOR gate having one input terminal for receiving the charging signal; and
 a second inverter for inverting an output of the NOR gate and outputting the inverted signal to the data I/O line coupled to the other input terminal of the NOR gate.

7. The semiconductor memory device as recited in claim 2, wherein the latch unit includes:
 a NAND gate having one input terminal for receiving the charging signal and an output terminal coupled to the data I/O line; and
 an inverter for inverting an output of the NAND gate and outputting the inverted signal to the other input terminal of the NAND gate.

8. The semiconductor memory device as recited in claim 2, wherein the charging unit includes a first inverter for inverting the clock enable signal and outputting the inverted signal as the charging signal to the latch unit.

9. The semiconductor memory device as recited in claim 8, wherein the latch unit includes:
 a NOR gate having one input terminal for receiving the charging signal; and
 a second inverter for inverting an output of the NOR gate and outputting the inverted signal to the data I/O line coupled to the other input terminal of the NOR gate.

10. A semiconductor memory device having an active state for performing a read or write operation and an inactive state, comprising:
 a data input/output (I/O) line;
 a pull-up latch unit for pulling-up the data I/O line when the semiconductor memory device is in the inactive state;
 a pull-down latch unit for pulling-down the data I/O line when the semiconductor memory device is in the inactive state; and
 a selection unit for selectively driving one of the pull-up latch unit and the pull-down latch unit,
 wherein the pull-up latch unit includes:
  a latch unit for preventing the data I/O line from floating; and
  a charging unit for controlling the latch unit to charge the data I/O line when the semiconductor memory device is in the inactive state by determining a logic level of an output signal of the latch unit based on a charging signal generated by using a self-refresh signal transitioning a self-refresh mode.

11. The semiconductor memory device as recited in claim 10, wherein the charging unit includes a first inverter for inverting the self-refresh signal and outputting the inverted signal as the charging signal to the latch unit.

12. The semiconductor memory device as recited in claim 11, wherein the latch unit includes:
- a NAND gate having one input terminal for receiving the charging signal and an output terminal coupled to the data I/O line; and
- a second inverter for inverting an output of the NAND gate and outputting the inverted signal to the other input terminal of the NAND gate.

13. The semiconductor memory device as recited in claim 10, wherein the latch unit includes:
- a NOR gate having one input terminal for receiving the charging signal; and
- an inverter for inverting an output of the NOR gate and outputting the inverted signal to the data I/O line coupled to the other input terminal of the NOR gate.

14. The semiconductor memory device as recited in claim 2, wherein the pull-down latch unit includes:
- a latch unit for preventing the data I/O line from floating; and
- a discharging unit for controlling the latch unit to discharge the data I/O line when the semiconductor memory device is in the inactive state.

15. The semiconductor memory device as recited in claim 14, wherein the discharging unit determines a logic level of an output signal of the latch unit based on a discharging signal generated by combining a clock enable signal denoting an enable state of a clock signal of the semiconductor memory device and a row address strobe (RAS) idle signal transitioning the standby mode.

16. The semiconductor memory device as recited in claim 15, wherein the discharging unit includes:
- a first inverter for inverting the RAS idle signal; and
- a NAND gate for performing a NAND operation of the clock enable signal and an output of the first inverter, thereby outputting the discharging signal to the latch unit.

17. The semiconductor memory device as recited in claim 16, wherein the latch unit includes:
- a NOR gate having one input terminal for receiving the discharging signal and an output terminal coupled to the data I/O line; and
- a second inverter for inverting an output of the NOR gate and outputting the inverted signal to the other input terminal of the NOR gate.

18. The semiconductor memory device as recited in claim 15, wherein the discharging unit includes:
- a first inverter for inverting the clock enable signal; and
- a NOR gate for performing a NOR operation of the RAS idle signal and an output of the first inverter, thereby outputting the discharging signal to the latch unit.

19. The semiconductor memory device as recited in claim 18, wherein the latch unit includes:
- a NAND gate having one input terminal for receiving the discharging signal; and
- a second inverter for inverting an output of the NAND gate and outputting the inverted signal to the data I/O line coupled to the other input terminal of the NAND gate.

20. The semiconductor memory device as recited in claim 14, wherein the discharging unit determines a logic level of an output signal of the latch unit based on a discharging signal generated by using a clock enable signal denoting an enable state of a clock signal of the semiconductor memory device.

21. The semiconductor memory device as recited in claim 20, wherein the discharging unit includes a first inverter for inverting the clock enable signal and outputting the inverted signal as the discharging signal to the latch unit.

22. The semiconductor memory device as recited in claim 21, wherein the latch unit includes:
- a NOR gate having one input terminal for receiving the discharging signal and an output terminal coupled to the data I/O line; and
- a second inverter for inverting an output of the NOR gate and outputting the inverted signal to the other input terminal of the NOR gate.

23. The semiconductor memory device as recited in claim 20, wherein the latch unit includes:
- a NAND gate having one input terminal for receiving the discharging signal; and
- an inverter for inverting an output of the NAND gate and outputting the inverted signal to the data I/O line coupled to the other input terminal of the NAND gate.

24. The semiconductor memory device as recited in claim 14, wherein the discharging unit determines a logic level of an output signal of the latch unit based on a discharging signal generated by using a self-refresh signal transitioning the self-refresh mode.

25. The semiconductor memory device as recited in claim 24, wherein the latch unit includes:
- a NOR gate having one input terminal for receiving the discharging signal and an output terminal coupled to the data I/O line; and
- an inverter for inverting an output of the NOR gate and outputting the inverted signal to the other input terminal of the NOR gate.

26. The semiconductor memory device as recited in claim 24, wherein the discharging unit includes a first inverter for inverting the self-refresh signal and outputting the inverted signal as the discharging signal to the latch unit.

27. The semiconductor memory device as recited in claim 26, wherein the latch unit includes:
- a NAND gate having one input terminal for receiving the discharging signal; and
- a second inverter for inverting an output of the first NAND gate and outputting the inverted signal to the data I/O line coupled to the other input terminal of the first NAND gate.

28. The semiconductor memory device as recited in claim 2, wherein the selection unit includes:
- a selection signal generating unit for generating a selection signal in response to a test mode selection signal enabled during a test mode; and
- a multiplexing unit for selecting one of the charging unit and the discharging unit to the data I/O line based on the selection signal.

29. The semiconductor memory device as recited in claim 28, wherein the multiplexing unit includes:
- an inverter for inverting the selection signal;
- a first transfer gate for transferring an output of the charging latch unit to the data I/O line in response to the selection signal and an output of the inverter; and
- a second transfer gate for transferring an output of the discharging latch unit to the data I/O line in response to the selection signal and an output of the inverter.

30. The semiconductor memory device as recited in claim 28, wherein the selection signal generating unit includes a fuse for fixing a logic level of the selection signal after the test mode.

31. The semiconductor memory device as recited in claim 28, wherein the selection signal generating unit includes:
- a first MOS transistor having one terminal coupled to a source voltage and a gate for receiving the test mode selecting signal;

a fuse having one terminal coupled to the other terminal of the first MOS transistor;

a second MOS transistor coupled between a ground voltage and the other terminal of the fuse and having a gate for receiving the test mode selecting signal; and an odd number of inverters coupled to a common terminal of the fuse and the second MOS transistor, thereby outputting the selection signal.

32. The semiconductor memory device as recited in claim 1, wherein the data I/O line includes a global data input/output (I/O) line.

33. The semiconductor memory device as recited in claim 1, wherein the data I/O line includes a local data input/output (I/O) line.

* * * * *